United States Patent [19]

Faure et al.

[11] 4,227,149

[45] Oct. 7, 1980

[54] SENSING PROBE FOR DETERMINING LOCATION OF CONDUCTIVE FEATURES

[75] Inventors: Louis H. Faure, Poughkeepsie, N.Y.; Philo B. Hodge, Roxbury, Conn.

[73] Assignee: International Business Machines Corporation, Armonk, N.Y.

[21] Appl. No.: 910,253

[22] Filed: May 30, 1978

[51] Int. Cl.³ .................... G01R 1/073; G01R 31/02
[52] U.S. Cl. ............................... 324/158 P; 324/51; 324/158 F
[58] Field of Search .............. 324/51, 72.5, 73 PC, 324/158 P, 158 F

[56] References Cited

U.S. PATENT DOCUMENTS

| | | |
|---|---|---|
| 2,932,015 | 5/1960 | Kelly . |
| 3,611,128 | 10/1971 | Nagata ........................ 324/158 P X |
| 3,676,776 | 7/1972 | Bauer et al. ................. 324/158 P X |
| 3,806,801 | 4/1974 | Bove ............................ 324/72.5 |
| 3,996,516 | 12/1976 | Luther . |
| 4,019,015 | 4/1977 | Hassan et al. . |
| 4,052,793 | 10/1977 | Coughlin et al. ............ 324/51 UX |
| 4,063,172 | 12/1977 | Faure et al. ................. 324/158 F X |
| 4,177,425 | 12/1979 | Lenz ............................ 324/158 P |

OTHER PUBLICATIONS

Bruder et al., Buckling Beam Probe, *IBM Tech. Discl. Bulletin*, vol. 16, No. 5, Oct. 1973, p. 1366.
Dougherty, W. E., Probe Tips, *IBM Technical Disclosure Bulletin*, vol. 18, No. 10, Mar. 1976, p. 3304.
Grandia et al., Rapid-Loading, Low-Stress Sample Holder, *IBM Tech. Disc. Bull.*, vol. 12, No. 4, Sep. 1969, p. 595.
Till, A. W., Column Contact Probe, *IBM Tech. Disc. Bull.*, vol. 12, No. 4, Sep. 1969, p. 551.

*Primary Examiner*—Gerard R. Strecker
*Attorney, Agent, or Firm*—Wolmar J. Stoffel

[57] ABSTRACT

A sensing apparatus for determining the precise location of a conductive feature on an insulating substrate which has a base, a plurality of flexible flat elongated contact blade elements having end portions for contacting and establishing electrical contact to a conductive surface feature, insulating means between the blade elements, and a base member for supporting the blade elements in a bowed condition with the end portions arranged in a plane parallel to the plane of the top surface of the insulating substrate.

7 Claims, 6 Drawing Figures

SENSING PROBE FOR DETERMINING LOCATION OF CONDUCTIVE FEATURES

DESCRIPTION

1. Technical Field

This invention relates to apparatus for testing electrical elements, more particularly to a system for determining the location of conductive features on a substrate, and more particularly to a system for determining the coordinate location in the X-Y direction of a set of electrically conductive surface features on an insulating substrate.

One object of the present invention is to provide a system for determining the location of conductive features on a substrate.

Another object of the present invention is to provide a system for determining the coordinate location in the X and Y directions of the set of electrically conductive surface features on an insulating substrate.

Another object of the present invention is to provide a sensing probe head for determining the location of an electrically conductive surface feature on a substrate.

Yet another object of this invention is to provide a sensing probe head provided with a plurality of elongated flat flexible band elements, each having a thickness significantly less than the width of the conductive feature being detected which can be lowered over the feature by a suitable support to accurately determine the location of the conductive feature.

2. Background Art

In recent years the trend toward large scale integration (LSI) of various active and passive circuits on a single semiconductor chip has grown. Simultaneously the ability to compact entire machines unto substrates which, for example, may plug directly into a chassis and comprise the entire hardware of any given or existing machine has grown. In these instances the substrate may be relatively large and may include multiple LSI sites or locations for receiving, as by the well known C4 joint or other attachment means, the semiconductor chips. These sites joining the chips may be interconnected, depending on the machine design, either through external wiring or in the case of multi-layer ceramic substrates, may be interconnected where appropriate through one or more of the layers of the multilayer ceramic. Regardless of the composition of the substrates, i.e. whether it be ceramic, epoxy, or some other form, each of the chip sites includes a plurality of contacts of the substrates which must be checked as to its electrical relationship with other chip sites for both continuity and discontinuity where appropriate. This has raised problems in automatic testing of the passive circuit configuration. The dimensional problems, such as shrinking or expansion of the substrate, makes it very difficult to make proper contact of the test probes to the contacts which are arranged in a pattern on the substrate.

Sophisticated multi-layer ceramic semiconductor packages can be produced by forming green ceramic sheets by doctor blading and subsequently drying a slurry containing particulate ceramic material, organic binders, solvents, and a plasticizer. The ceramic sheets are punched to form via holes, and screen printed with a conductive paste to fill the holes and form circuit patterns. Subsequently, the sheets are stacked and the unit sintered to form a unitary ceramic substrate with an internal circuitry structure. Very complex and dense circuitry can be achieved which will permit the mounting of many interconnected integrated circuit semiconductor devices on a single substrate. It is convenient to mount the semiconductor devices using solder bonding technology on the top surface of the substrate. The devices, which may number up to a hundred or more, are mounted on solder pads which in turn are connected to the internal metallurgy and I/O pins on the bottom surface.

Multi-layer ceramic substrates shrink from 15 to 20% during sintering. Frequently the shrinkage is not precisely uniform and consequently the overall pad pattern on the surface is distorted. This distortion of the pad pattern raises a problem when electrical contact must be made during the necessary testing of the substrate. A potential solution is presented in U.S. Pat. No. 4,063,172 wherein the probe is made up of many sections and the sections are made moveable relative to each other to accommodate for linear distortion of the substrate and its pad pattern. However, this probe is quite expensive and it ordinarily must be tailored to a specific substrate. Further, it can only accommodate linear uniform distortion. For example if one side of the MLC substrate shrinks more than the other side rotation of the sections of the pad pattern will occur. This probe cannot partially rotate the probe segments to accommodate for this type of distortion.

Another approach to testing the complex substrate circuitry is to systematically step the contact probes, which contact only a portion of the pad pattern, i.e. a pad pattern for a single device, over the entire pad pattern. The stepping of the probe continues until all combinations of pad pattern segments and the associated internal interconnection circuitry have been tested.

The implementation of the probe stepping technique, as well as the segmented probe described previously, requires information as to the location of each of the set of pads to be contacted by the probe, so that the probe will contact the pads and not miss them. One technique for acquiring this type of information is presented in U.S. Pat. No. 4,052,793.

BRIEF DESCRIPTION OF THE DRAWINGS

In the accompanying drawings forming a material part of this disclosure.

DISCLOSURE OF THE INVENTION

Figure 1:
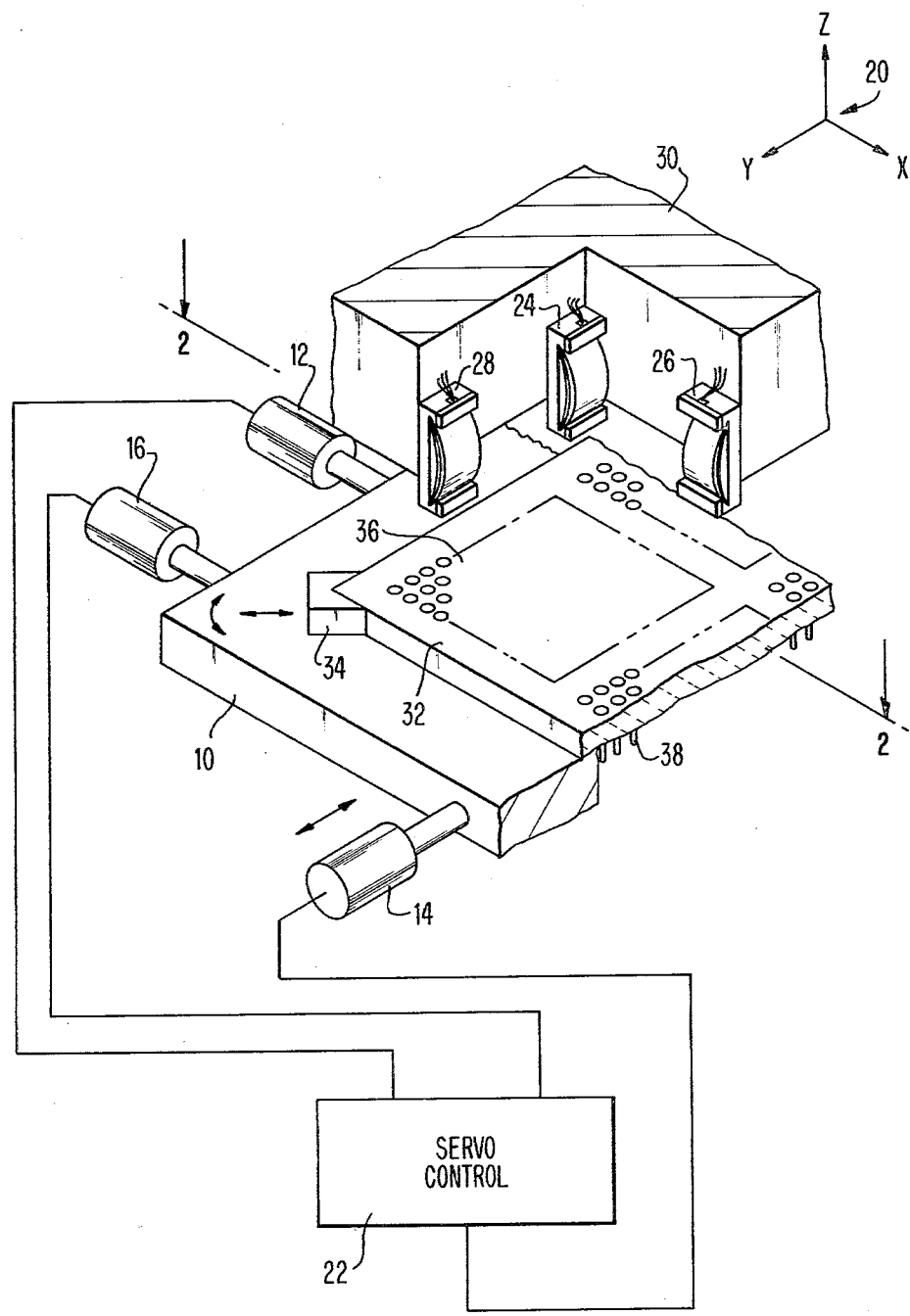
FIG. 1 is an isometric view in broken section illustrating the overall system for determining the coordinate location of a set of pads on a substrate of the invention.

For further comprehension of the invention, and of the objects and advantages thereof, reference will be made to the following description and accompanying drawings, and to the appended claims in which the various novel features of the invention are more particularly set forth.

Referring now to the drawings there is depicted a preferred specific embodiment of the system for determining location of electrical conductive surface features and subcombination elements thereof. In the drawings the various elements are not necessarily drawn exactly to scale. Some of the dimensions are exaggerated in order to simplify the explanation and more clearly indicate the principles involved.

Referring now to FIG. 1 there is shown the overall system which includes a substrate support table 10 moveably mounted on a bench or other support. The precise position of table 10 is controlled by a servo control system which includes a servo motor 12 for moving the table in the X direction, a second servo motor 14 for moving the table in the Y direction, and a third servo motor 16 for imparting a turning or rotational movement to table 10. The X, Y and Z directions relative to the apparatus is given by X, Y and Z arrows 20. A servo control 22 is provided to energize the servo motors 12, 14 and 16. The servo control is in turn controlled by a software program which indexes the table to the proper locations so that it can be subject to sensing probes 24, 26 and 28 supported on a sensing probe support 30. A substrate 32, typically a multi-layer ceramic substrate is located and held on table 10 by a suitable retaining means as for example a moveable jaw 34. The jaw 34 operates in combination with either a second jaw (not shown), an abutment on the opposite side of the substrate, (not shown), or other suitable fixed abutment means. Substrate 32 has a plurality of pad patterns 36 on the top surface thereof formed of a conductive material. In general the pad patterns 36 will normally be subsequently interconnected to an integrated circuit device using flipchip bonding technology. The substrate can have any suitable number of pad patterns 36 which can exceed 100 in number. The pad patterns 36 are usually similar in configuration and are interconnected to I/O pins 38 on the bottom surface of substrate 32.

Figure 2:
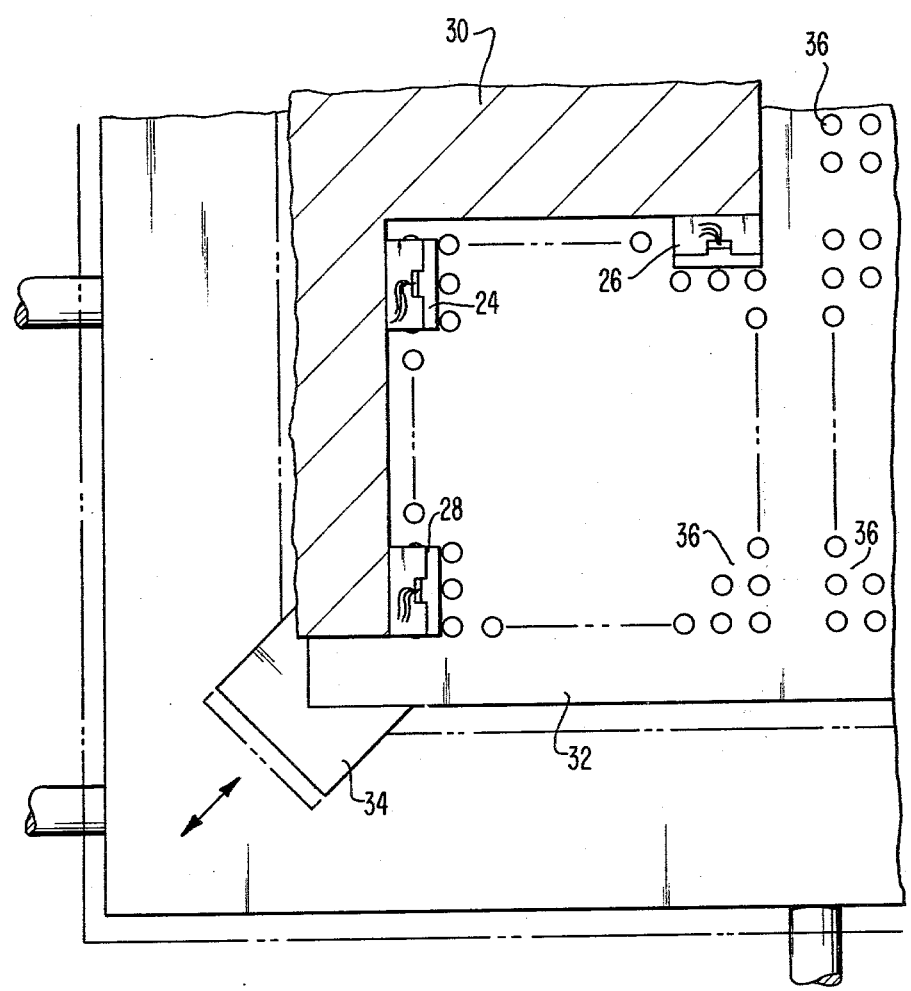
FIG. 2 is a top view in broken section of the apparatus illustrated in FIG. 1 taken on Line 2—2.

The function of the preferred embodiment illustrated in FIGS. 1 and 2 is adapted to provide an accurate location indication of each of the pad patterns 36 on the substrate using selected individual pads of the pattern as reference points. The sensing probes 24, 26, and 28 mounted on probe support 30 are moveable in the Z direction into and out of engagement with the pad pattern on substrate 32. The position of the substrate can be moved with the servo control 22 to position other pad patterns on the substrate beneath the probe support. When the probe support is moved downwardly into contact with the pad pattern the sensing probes will provide an accurate indication of the location of the reference pads of the pattern 36 which can be used to subsequently make electrical contact with pads with a suitable probe and carry out the tests required for testing the internal circuitry of the substrate. This information will ordinarily be stored in a memory unit and used at a later time.

Figure 3:
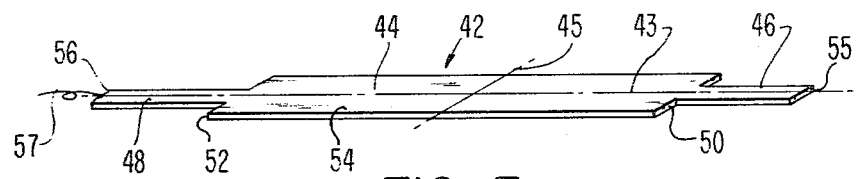
FIG. 3 is a isometric view of a blade element used in the probe of the invention.
Figure 4:
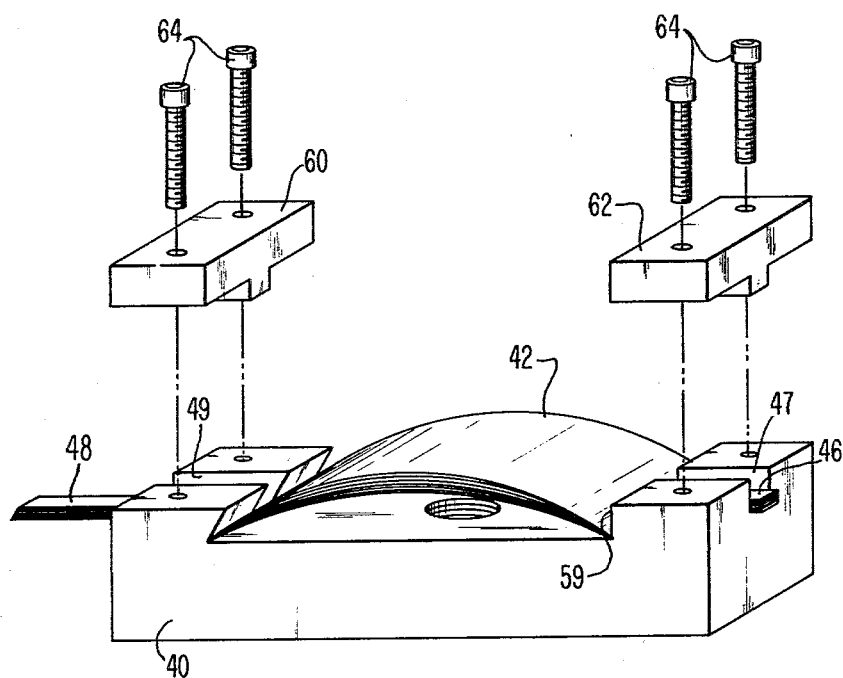
FIG. 4 is an isometric view in exploded relation illustrating the structure of a contact probe of the invention.
Figure 4A:
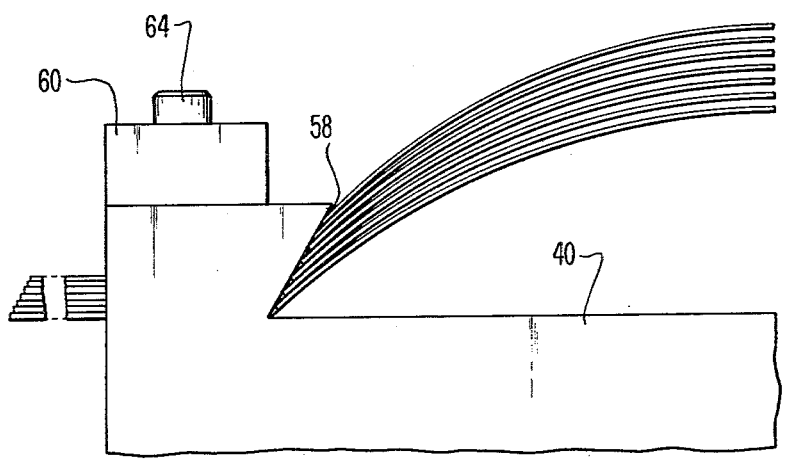
FIG. 4A is an elevational view in enlarged scale illustrating the structure for producing increased bowing of the blade elements of the probes.

Referring now to FIG. 4 there is depicted the structure of the individual sensing heads 24, 26, and 28. The sensing head has a base 40 adapted to hold a plurality of blade elements 42 in flexed biasing relation. The blade element 42, as shown in FIG. 3, has a central portion 44, a contact portion 46 and a connector portion 48. Abutment surfaces 50 and 52 are provided on each end of the central portion 44. The blade element 42 has a major axis 43 and a minor axis 45. Blade elements 42 has a coating of dielectric material 54, preferably "Teflon" (polytetrafluoroethylene), on the surface thereof except on the contacting surface 55 and the portion 56 which is adapted to be connected to a lead 57. Blades 42 are relatively thin so that at least two will contact the pad. The thickness will typically be in the range of 0.001" to 0.003" the thickness of the insulation 43 will typically be in the range of 0.0001" to 0.005". As illustrated in FIG. 4 the blade elements 42 are seated in the base 40 with the central portion bowed as shown and the end portions 46 and 48 in groove 47 and 49. As indicated in FIG. 4 each of the blade elements are successively bowed slightly more than the preceding one. This successive bowing of the blade elements is achieved by providing an inclined abutting surface 58 which engages the abutting surface 52 of blade elements 42. As additional blade elements 42 are stacked on the base 40 the distance between the abutting surfaces 58 and 59 decreases resulting in successively bowing of each of the blade elements to a slightly greater degree. After the required number of blade elements 42 are placed on base 40 cross bars 60 and 62 are secured in place with screws 64 locking the blade elements in operative engagement but allowing longitudinal sliding movement of portions 55 of blade elements 42.

Figure 2A:
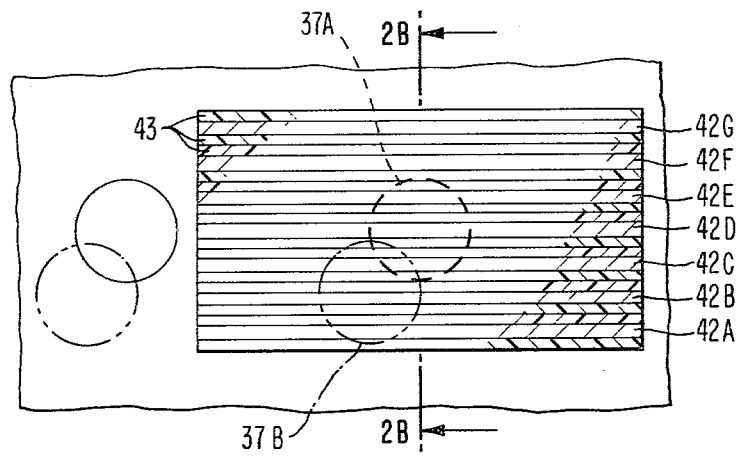
FIG. 2A is a top plan view in cross section in enlarged scale taken through a probe illustrating different placements of a pad being detected.
Figure 2B:
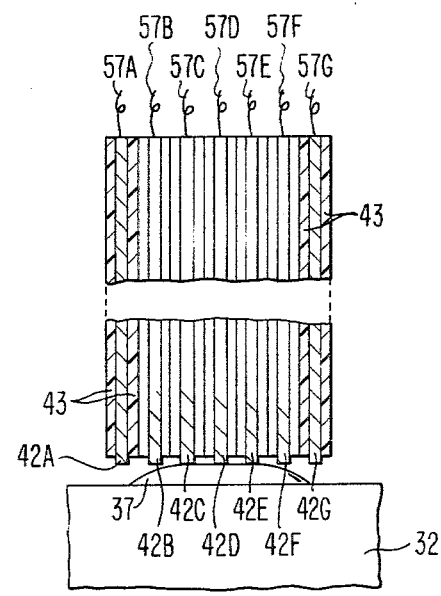
FIG. 2B is a side view in broken section taken on line 2B of FIG. 2A.

The blades 42 of the sensor are bowed, as shown in FIG. 4 in order to permit individual limited longitudinal movement of the contact portions 46. This will allow limited conformation to an irregular surface. As for example as shown in FIG. 2B blades 42C, 42D and 42E contact the pad 37. If blade 42D, which contacts the crown of pad 37, were rigid it might prevent the two blades on either side from contacting the pad. In addition, the provision for obtaining progressive bowing of the elements with the surface 58 as shown in FIG. 4 allows intermediate blades to flex even though the adjacent blades are still in their original extended position.

Another sensor embodiment, not illustrated, can consist of a plurality of blades, insulated from each other by a thin coating, which are individual cantilever blade elements. The cantilever elements are essentially thin blades shaped in an L configuration and supported so that any flexing necessary to conform to the pad being sensed is taken up by a slight bending of the leg of the cantilever element. The large or long portions of the blades are maintained in close parallel relation corresponding to the position of end portions 46 of blades 42. Each successive blade can be provided with a slightly longer leg portion so that there is a slight spacing to accommodate for some of the blades to retract. The leg portions are suitably secured so that the end portions of the blades, which sense the presence of a conductive feature, are arranged in a plane parallel to the plane of the top surface of the substrate being tested.

In operation, the sensing system of the invention as illustrated in FIG. 1 is initiated when the probe support 30 is brought down over a substrate 32 having a pad pattern 36 thereon. The sensors 24, 26 and 28 are located on the probe support 30 to detect predetermined pads of the pattern which are used as references to determine the exact location of the pad pattern. The substrate 32 is located beneath the probe support in the approximate location so that the sensors will contact the reference pads. When the blades 42A through 42G of the sensor near the surface of the substrate 32, the pads 37 which normally protrude slightly above the surface are contacted with two or more of the blades. As shown in FIG. 2B blades 42C, 42D and 42E contact the pad 37A which results in shorting of the three blades. This condition can be detected with a suitable circuit, not illustrated, since the blade elements are provided with terminals 57A through 57G with communicate with the circuit. The blade elements which are shorted, of course, depend on the location of the pad 37. For example, in FIG. 2A a pad 37A in the position indicated shorts out the blades 42C, 42D and 42E. In contrast, pad 37B in the position illustrated shorts out blade elements 42A, 42B and 42C. The size of the pads as well as the thickness of the blade will determine the number of blades that are shorted by a given pad. The position and number of contacts shorted together are detected and the information recorded, either manually or with a computer provided with a suitable software program.

Referring to FIG. 1, sensor 24 is adapted to determine the exact location of the pad pattern with respect to the X direction, sensor 26 will determine the location of the pad pattern in the Y direction, and sensor 28 is adapted in combination with sensor 24 to determine the angular position of the pad pattern. Sensor 24 has blade elements 42 arranged with the minor axis 45 oriented orthogonally to the X direction; sensor 26 has its blades 42 arranged with the minor axis 45 oriented orthogonally to the Y direction; and sensor 28 has its blades 42 oriented orthogonally to the X direction. The information determined by the shorted blade elements when combined with reference location of the probe makes possible a precise determination of the location of the pad pattern on the substrate with only a single pass. Subsequently, the substrate is moved and the sensing probe support 30 moved downwardly over a second pad pattern 36 and the operation repeated. In this manner information can be gathered as to the exact location of all of the pad patterns on the substrate. If desired the locations of spaced pad patterns can be determined and the location of the intervening pad patterns approximated based on the location of the detected patterns. After the substrate 32 has been covered by the aforedescribed sensing probes the probe support 30 can be moved out of the way and testing probes which make electrical contact to the individual pad patterns stepped over the substrate making the various necessary tests. The servo mechanisms 12, 14 and 16 can be used to drive the substrate support 10 and locate it relative to the test probe so that contact is made to each and every pad.

As mentioned previously, the substrate 32 is initially located beneath sensing probes support 30 so that the probability is good that the sensors 24, 26 and 28 will contact the proper reference pads of the patterns 36. However, by programming the computer driving the system it is possible to detect when the wrong reference pads are underneath the sensing elements as may happen when the distortion of the substrate is extreme. For example, if the reference pads are located in the outside row and the probes miss the pattern in one direction such that the sensors fall outside the pattern, this condition can be detected and appropriate corrections made. When the same substrate support is used for the test as well as for determining the location of the pad patterns suitable contacts are made to the I/O pins 38 on the bottom side of the substrate 32 for testing purposes. However, the determination of the pad pattern does not require contact to the circuitry in the substrate since the system depends entirely on the shorting between adjacent blade elements. Modifications can be made to the system. For example, the substrate can be fixed in the X and Y directions, and the probe support 30 moved from pad location to pad location if desired. Also the probe sensor can be used for other purposes, i.e. to determine presence or absence of a conductive feature.

Having thus described my invention, what I claim as new, and desire to secure by Letters Patent is:

1. A system for determining the coordinate location in the X and Y directions of a set of electrically conductive surface features on an insulating substrate comprising:

a support for said substrate, at least two sensor heads mounted above said support for said substrate, each of said sensor heads having a mounting base that supports a plurality of elongated flexible flat electrically conductive sensing blade elements, insulation means electrically insulating adjacent sensing blade elements from each other, the flat ends of said blade elements terminating in a plane parallel to the top surface of said substrate for contact with said electrically conductive surface features, said blade elements arranged so that the center to center distance of at least two elements is less than the width of one of said conduction features, and a means to hold said sensing blade elements in a slightly bowed position such that each successive element has a greater bow, said bowed position of said blade elements permitting retraction of individual blade elements without affecting adjacent unretracted blade elements to permit independent limited movement of the contact portions of said individual blade elements, a first of said sensor heads arranged with the minor axis of the blade elements oriented orthogonally to the said X direction, a second of said sensor heads arranged with the minor axis of said blade elements oriented orthogonally to said Y direction, a means to move said sensor heads in the Z direction into engagement with said substrate, a means associated with each sensor head to determine whether or not said blade elements are electrically shorted by contact with said surface features, said first and said second sensor heads in operation providing an indication of the location of selected surface features resulting from the shorting of the blades of said sensors by said surface features.

2. The system of claim 1 wherein a third sensor head is provided for determining angular orientation of said surface features.

3. The system of claim 2 wherein said third sensor head is spaced from said first sensor head with said blade elements arranged with the minor axis oriented orthogonally to the X direction.

4. The system of claim 1 wherein each of said sensing heads further includes blade elements provided with a flexible intermediate portions, and abutment surfaces defining the ends of said intermediate portion, said mounting base has spaced abutment means that engage said abutment surfaces on said intermediate portion of said blade elements to maintain the bowed relation.

5. A sensing heads for determining the location of electrically conductive surface features on an insulating substrate comprising:

a mounting base, a plurality of elongated closely packed flat flexible electrically conductive blade elements each having a major axis and supported on said mounting base, in generally parallel relationship one upon the other, insulation means to electrically insulate said adjacent blade elements from each other, end portions on said blade elements that terminate in a plane generally perpendicular to the major axis of said blade elements for making contact with the conductive surface features on said insulating substrate, means on said mounting base to hold said blade elements in a slightly bowed position, such that each successive element has a greater bow, said bowed position of said blade elements permitting retraction of individual blade elements without affecting adjacent unretracted blade elements to permit independent limited movement of the contact portions of said individual blade elements.

6. The sensing head of claim 5 wherein each of said blade elements are provided with a flexible intermediate portions, and abutment surfaces defining the ends of said intermediate portion, said means on said mounting base having spaced abutment means that engages said abutment surfaces on said intermediate portion of said blade elements to maintain the bowed relation.

7. The sensing head of claim 6 wherein said abutment means on said mounting base is comprised of a first flat surface that is parallel to said plane of the terminating and portions of said blade elements, and a second flat surface which is inclined relative to said first flat surface, said first and said second flat surfaces of said abutment means spaced a distance slightly less than the length of said intermediate portions of said blades.

* * * * *